United States Patent
Barzen et al.

(10) Patent No.: US 9,179,221 B2
(45) Date of Patent: Nov. 3, 2015

(54) MEMS DEVICES, INTERFACE CIRCUITS, AND METHODS OF MAKING THEREOF

(71) Applicant: Infineon Technologies AG, Neubiberg (DE)

(72) Inventors: Stefan Barzen, Munich (DE); Andreas Wiesbauer, Poertschach (AT); Christian Jenkner, Klagenfurt (AT); Marc Fueldner, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/255,703

(22) Filed: Apr. 17, 2014

(65) Prior Publication Data

US 2015/0023529 A1 Jan. 22, 2015

Related U.S. Application Data

(60) Provisional application No. 61/847,874, filed on Jul. 18, 2013.

(51) Int. Cl.
| | |
|---|---|
| *H04R 19/00* | (2006.01) |
| *H04R 19/04* | (2006.01) |
| *G01R 27/26* | (2006.01) |
| *H04R 1/08* | (2006.01) |
| *B81B 3/00* | (2006.01) |
| *H04R 31/00* | (2006.01) |

(52) U.S. Cl.
CPC .............. *H04R 19/04* (2013.01); *B81B 3/0086* (2013.01); *G01R 27/2605* (2013.01); *H04R 1/08* (2013.01); *H04R 19/005* (2013.01); *H04R 31/00* (2013.01); *B81B 2201/0257* (2013.01); *B81B 2203/0127* (2013.01); *H04R 2201/003* (2013.01); *H04R 2410/03* (2013.01)

(58) Field of Classification Search
CPC ............ H04R 1/04; H04R 1/24; H04R 1/245; H04R 1/26; H04R 1/265; H04R 1/40; H04R 1/406; H04R 3/005; H04R 3/04; H04R 3/06; H04R 19/02; H04R 19/04
USPC ......... 381/113, 116, 355–358, 369, 170, 174, 381/176, 191, 399; 310/309, 311, 322, 324
See application file for complete search history.

(56) References Cited

U.S. PATENT DOCUMENTS

| | | | | |
|---|---|---|---|---|
| 3,646,280 | A * | 2/1972 | Tamura et al. | 381/191 |
| 3,896,274 | A * | 7/1975 | Fraim et al. | 381/191 |
| 4,329,547 | A * | 5/1982 | Imai | 381/163 |
| 4,491,697 | A * | 1/1985 | Tanaka et al. | 381/113 |
| 4,757,545 | A * | 7/1988 | Rosander | 381/92 |
| 5,214,709 | A * | 5/1993 | Ribic | 381/313 |
| 5,490,220 | A * | 2/1996 | Loeppert | 381/355 |
| 6,175,636 | B1 * | 1/2001 | Norris et al. | 381/398 |

(Continued)

FOREIGN PATENT DOCUMENTS

JP 2008153981 A * 7/2008

*Primary Examiner* — Curtis Kuntz
*Assistant Examiner* — Joshua A Kaufman
(74) *Attorney, Agent, or Firm* — Slater & Matsil, L.L.P.

(57) ABSTRACT

A micro-electro-mechanical system (MEMS) device includes a first plate, a second plate disposed over the first plate, and a first moveable plate disposed between the first plate and the second plate. The MEMS device further includes a second moveable plate disposed between the first moveable plate and the second plate.

25 Claims, 16 Drawing Sheets

(56) References Cited

U.S. PATENT DOCUMENTS

| | | | |
|---|---|---|---|
| 7,106,869 B2* | 9/2006 | Kanda et al. | 381/174 |
| 8,213,661 B2* | 7/2012 | Hinke | 381/355 |
| 8,243,956 B2* | 8/2012 | Turnbull | 381/95 |
| 8,559,660 B2* | 10/2013 | Chiang et al. | 381/191 |
| 8,590,136 B2* | 11/2013 | Yang et al. | 29/594 |
| 8,600,083 B2* | 12/2013 | Chiang et al. | 381/191 |
| 8,644,545 B2* | 2/2014 | Akino | 381/355 |
| 8,664,733 B2* | 3/2014 | Rombach | 257/416 |
| 8,755,541 B2* | 6/2014 | Liu et al. | 381/174 |
| 8,860,154 B2* | 10/2014 | Wang | 257/416 |
| 8,873,777 B2* | 10/2014 | Yoshino | 381/174 |
| 2003/0123683 A1* | 7/2003 | Raicevich | 381/174 |
| 2005/0281419 A1* | 12/2005 | Miyazaki et al. | 381/191 |
| 2007/0076904 A1* | 4/2007 | Deruginsky et al. | 381/95 |
| 2010/0254549 A1* | 10/2010 | Onishi | 381/120 |
| 2011/0075865 A1* | 3/2011 | Yang et al. | 381/174 |
| 2011/0142261 A1* | 6/2011 | Josefsson | 381/107 |
| 2013/0044899 A1* | 2/2013 | Barber et al. | 381/113 |
| 2013/0108074 A1* | 5/2013 | Reining | 381/92 |

* cited by examiner

MEMS DEVICES, INTERFACE CIRCUITS, AND METHODS OF MAKING THEREOF

The present invention claims priority from U.S. Provisional Application No. 61/847,874 filed on Jul. 18, 2013, which is incorporated herein by reference.

TECHNICAL FIELD

The present invention relates generally to Micro-electromechanical system (MEMS) devices, and more particularly to MEMS devices, interface circuits, and methods of making thereof.

BACKGROUND

Micro-electro-mechanical system (MEMS) based sensors such as microphones gather information from the environment through measuring physical phenomena. The electronics then process the signal information derived from the sensors despite the presence of noise and parasitic effects. Advantageously, MEMS devices may be manufactured using batch fabrication techniques similar to those used for integrated circuits. Therefore, functionality, reliability, and sophistication may be integrated onto a small silicon chip at a relatively low cost.

MEMS devices may be formed as oscillators, resonators, accelerometers, gyroscopes, pressure sensors, microphone, micro-mirrors, and others. MEMS devices typically use capacitive sensing techniques for measuring the physical phenomenon being measured. In all these applications, the capacitance change of the capacitive sensor is converted into a usable voltage using interface circuits. However, interface circuits may become challenging due to the miniaturization of sensors in the presence of parasitic effects and reduced sense capacitance.

Some of the key characteristics of a MEMS device include sensitivity, bandwidth, linearity, dynamic range, minimum detectable signal, stability, size, and cost. Sensitivity of a MEMS device is the change in the output voltage for an input physical phenomenon (e.g., time varying pressure) derived change in capacitance at the capacitive sensor. Bandwidth is the range of frequencies over which the sensor can be used.

However, another important metric of a capacitive microphone is linearity. The linearity of the sensor is a measure of how close the output versus input calibration curve approximates a straight line at a given frequency. The slope between the input pressure and output voltage provides the sensitivity of the transducer at that frequency. At high input amplitudes the output of the transducer deviates from an ideal straight line. The lower and higher ends of the linear range are determined by both the sensor interface circuit and the sensor. The lower end is limited by system noise such as thermal noise, 1/f noise, and mechanical noise. The higher end of the linear range is determined by structural non-linearities such as spring stiffening or by circuit non-linearities such as clipping.

The dynamic range of a capacitive transducer is defined as the ratio of the maximum and minimum input signal of the linear range. The deviation of the output from the ideal linear curve causes distortion in the microphone output. When the system is excited at a single frequency, distortion may be computed as the minimum input amplitude that causes the output to deviate from linearity by a fixed percentage.

Therefore, one of the challenges relates to the production of MEMS devices and circuits with better functionality and reliability without increasing costs.

SUMMARY OF THE INVENTION

These and other problems are generally solved or circumvented, and technical advantages are generally achieved, by illustrative embodiments of the present invention.

In accordance with an embodiment of the present invention, a micro-electro-mechanical system (MEMS) device comprises a first plate, a second plate disposed over the first plate, and a first moveable plate disposed between the first plate and the second plate. The MEMS device further includes a second moveable plate disposed between the first moveable plate and the second plate.

In accordance with an embodiment of the present invention, a sensor circuit comprises a first filter circuit coupled between a voltage source and a first input bias node, which is configured to be coupled to a first plate of a first type of a capacitive sensor. The sensor circuit further comprises a second filter circuit coupled between the voltage source and a second input bias node, which is configured to be coupled to a second plate of the first type of the capacitive sensor. The capacitive sensor comprises the first plate of the first type capacitively coupled to a first plate of a second type and the second plate of the first type capacitively coupled to a second plate of the second type.

In accordance with an embodiment of the present invention, a method of forming a micro-electro-mechanical system (MEMS) device includes forming a first plate in or over a substrate, and forming a second plate over the first plate. A first moveable plate is formed between the first plate and the second plate. A second moveable plate is formed between the first moveable plate and the second plate.

BRIEF DESCRIPTION OF THE DRAWINGS

For a more complete understanding of the present invention, and the advantages thereof, reference is now made to the following descriptions taken in conjunction with the accompanying drawing, in which:

A conventional MEMS sensor circuit is illustrated in FIG. 1;

FIG. 5, which includes

FIG. 6, which includes

FIG. 7, which includes

FIG. 8, which includes

FIG. 10, which includes

FIG. 12, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
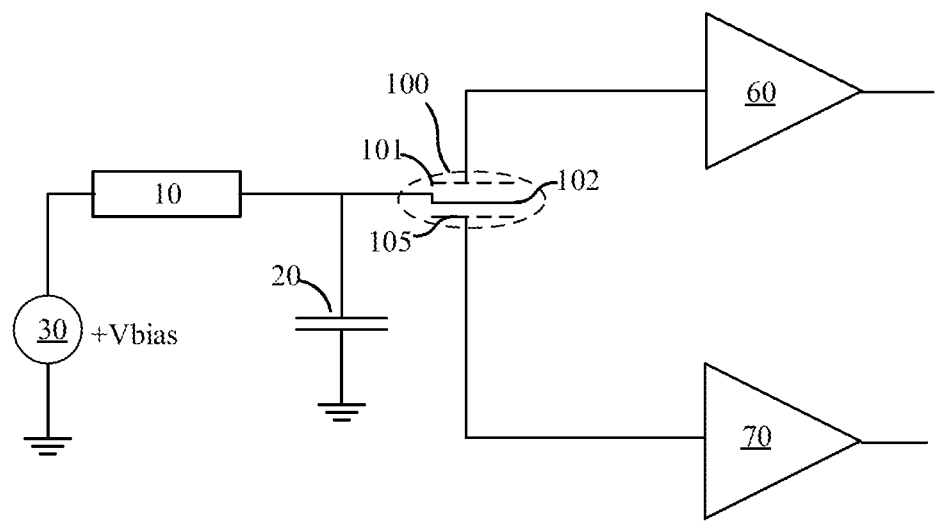

A conventional MEMS sensor circuit is illustrated in FIG. 1. The MEMS device 100 illustrated in FIG. 1 is a double back plate device having two fixed back plates: a first fixed plate 101 and a second fixed plate 105. A moveable plate 102 is disposed between the first and the second fixed plates 101 and 105. The output from the MEMS device 100 is input into first and second gain stages 60 and 70. A filter may be introduced between the voltage source and the MEMS sensor.

Accordingly, a double back plate MEMS device includes two capacitors, which change due to an incident pressure in opposite directions.

In order to handle MEMS production tolerances and to support different output sensitivity specifications, the sensor circuit has to provide the ability to adjust gains other than unity. One way to adjust the gain is by providing additional gain stages or to use amplifiers other than source followers. However, such techniques increase the noise of the amplifier and may also result in larger current consumption. Inverting amplifiers would additionally reduce the linearity of the system.

Another way to adjust the gain is by adjusting the bias of the voltage source or the potential at the membrane. However, this method may be applied only to reduce the signal provided by the MEMS device (under optimal bias conditions), which consequently results in a sub-optimum System Signal to Noise Ratio (SNR). In addition, bias voltage acts on both signal paths in the same manner (same gain factor). Consequently, adjusting the bias voltage does not provide a solution to apply different gains to each of the two signal path, e.g., to optimize a differential signal or to realize two different channels.

Embodiments of the invention improve gain without compromising linearity (or vice versa) of the MEMS device by using at least a dual diaphragm design. In various embodiments of the present invention, the MEMS device achieves a balance among power, performance and cost.

Figure 2:
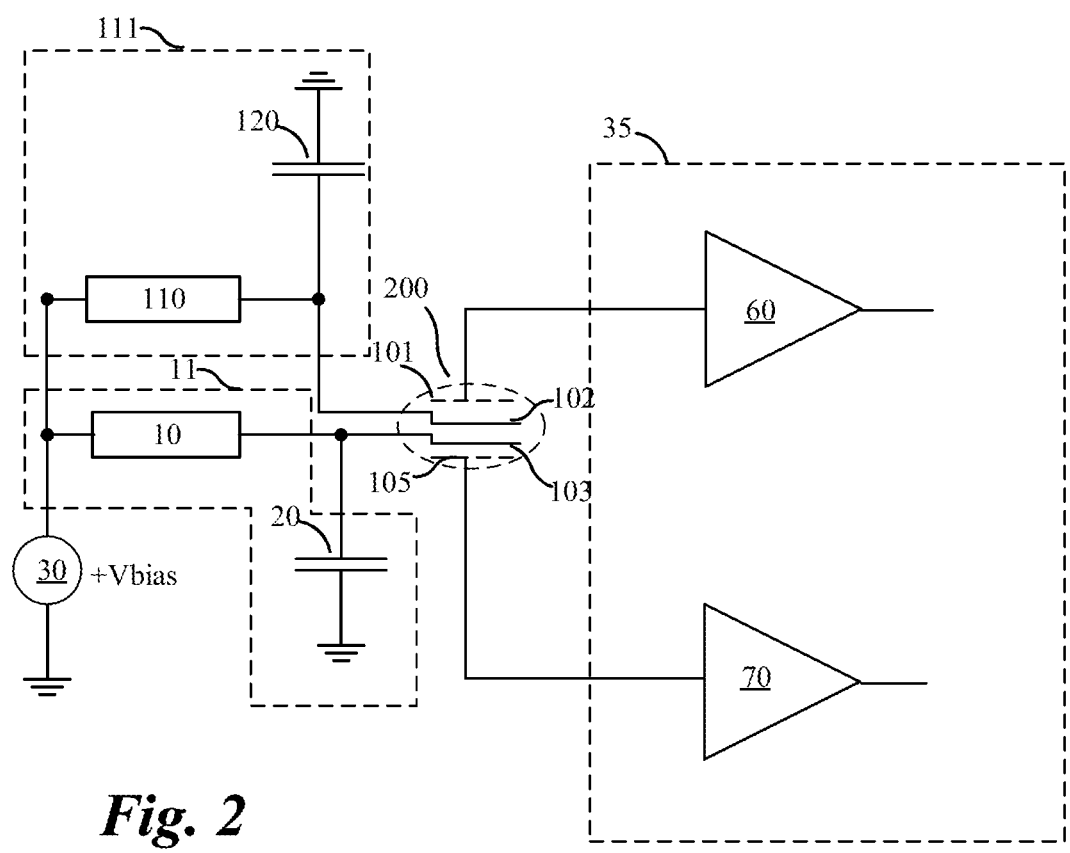
FIG. 2 illustrates a MEMS device and front end circuit in accordance with an embodiment of the present invention.

FIG. 2 illustrates a MEMS device and front end circuit in accordance with an embodiment of the present invention.

Embodiments of the present invention implement a double back plate and double diaphragm MEMS device with feedback to improve linearity and gain significantly. Referring to FIG. 2, a MEMS device 200 comprises a first fixed plate 101, a second fixed plate 105, a first moveable plate 102, and a second moveable plate 103. In one embodiment, a linear readout circuit is used. As illustrated, the first moveable plate 102, and the second moveable plate 103 are coupled to a low impedance voltage source while the first fixed plate 101 and the second fixed plate 105 are sensed with high impedance. The MEMS device 200 is operated in constant charge mode and the output voltage at the first and second output is proportional to the membrane displacement, i.e., displacement of the first moveable plate 102, and the second moveable plate 103 respectively.

Various embodiments of the present invention describe and apply passive feed-back techniques, e.g., around the source follower and the high voltage biasing filter. To implement such a technique, the MEMS device 200 comprises two separate electrically isolated parts: the first moveable plate 102 and the second moveable plate 103. While the first moveable plate 102 and the second moveable plate 103 are electrically isolated (not directly coupled or capacitively coupled), they are mechanically linked so that when the first moveable plate 102 moves towards the first fixed plate 101, the second moveable plate 103 moves away from the second fixed plate 105. In other words, the first moveable plate 102 is rigidly coupled with the second moveable plate 103. Thus, in various embodiments, the MEMS device 200 comprises four functionally relevant terminals.

The first fixed plate 101 and the second fixed plate 105 sense the displacement of the first movable plate 102 and the second moveable plate 103 respectively as a corresponding change in charge, which is input into the first and the second gain stages 60 and 70, which have a unity gain.

The filter of the high voltage biasing branch comprises two parts, a first filter circuit 11 and a second filter circuit 111. In one or more embodiments, the first filter circuit 11 and the second filter circuit 111 may comprise different low pass filters. In one embodiment, the first filter circuit 11 may comprise a first resistor 10 with a first capacitive filter 20 and the second filter circuit 111 may comprise a second resistor 110 and a second capacitive filter 120. In particular, due to the two separate pathways, the response at the first fixed plate 101 and the second fixed plate 105 may be adjusted independently. For example, the gains of both the paths may be adjusted to similar levels. Advantageously, this embodiment requires minimal power consumption.

In various embodiments, the first resistor 10 and the second resistor 110 may be formed from linear diodes, non-linear diodes, and/or metal insulator semiconductor transistors (operating in reverse). Similarly, the first capacitive filter 20 and the second capacitive filter 120 may comprise metal insulator semiconductor capacitors.

In various embodiments, the values of the first resistor 10, the first capacitive filter 20, the second resistor 110, and the second capacitive filter 120 may be programmable. For example, they may be programmed during initial factory testing after fabrication. In one or more embodiments, the feed-back loop may be implemented as part of the ASIC chip while the MEMS device 200 may be implemented in a MEMS wafer. In other embodiments, some of the components of the feed-back loop may be implemented within the MEMS wafer.

The sense circuit 35 may be implemented with a source follower circuit comprising a first gain stage 60 and a second gain stage 70 for its superior noise performance compared to other high impedance sense circuits. Each of the first gain stage 60 and the second gain stage 70 may comprise no amplification, i.e., gain equal to unity. A disadvantage of the source follower circuit is that it cannot provide a programmable gain but advantageously the gain is (ideally) unity, which may be controlled tightly.

Figure 3:
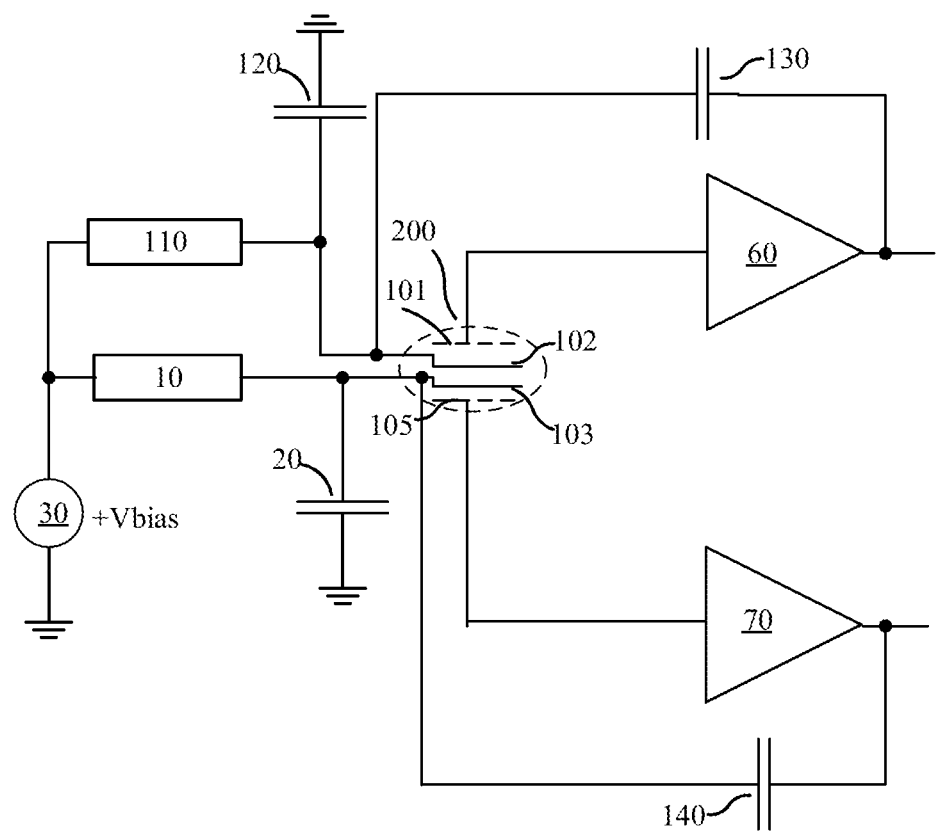
FIG. 3 illustrates a MEMS device with positive feed-back in accordance with an embodiment of the present invention.

FIG. 3 illustrates a differential microphone with positive feed-back in accordance with an embodiment of the present invention.

FIG. 3 illustrates improving gain through a positive feed-back loop in accordance with an alternative embodiment of the present invention. In this embodiment, a positive feed-back is applied from the output of the gain stage to the moveable plate, e.g., a first feed-back loop between the output of the first gain stage 60 and the first moveable plate 102, and a second feed-back loop between the output of the second gain stage 70 and the second moveable plate 103. In particular, due to the two separate feed-back loops, the corresponding response at the first fixed plate 101 and the second fixed plate 105 may be adjusted independently. Further, by applying positive feed-back from the output to the filter bias node, the available output signal is boosted even though the first and the second gain stages 60 and 70 may have unity gain.

In various embodiments, gain improvement is realized by using positive feed-back without active circuits and without significant noise and power penalty. In this embodiment, the gain at the first gain stage 60 (A60) is approximately (assuming that the capacitance of the capacitive filter is much greater than the variable capacitance between the plates of the MEMS device 200) given as follows: $A60=1+C130/C120$, where $C130$ is the capacitance of the first capacitor 130 and $C120$ is the capacitance of the first capacitive filter 120. Similarly, the gain at the second gain stage 70 (A70) is approximately given as follows: $A70=1+C140/C20$, wherein $C140$ is the capacitance of the second capacitor 140 and $C20$ is the capacitance of the second capacitive filter 20. In some embodiment, the capacitance of the first capacitor 130 and the capacitance of the second capacitor 140 may be about the same. Similarly, the capacitance of the first capacitive filter 120 may be the same as the capacitance of the second capacitive filter 20.

Figure 4:
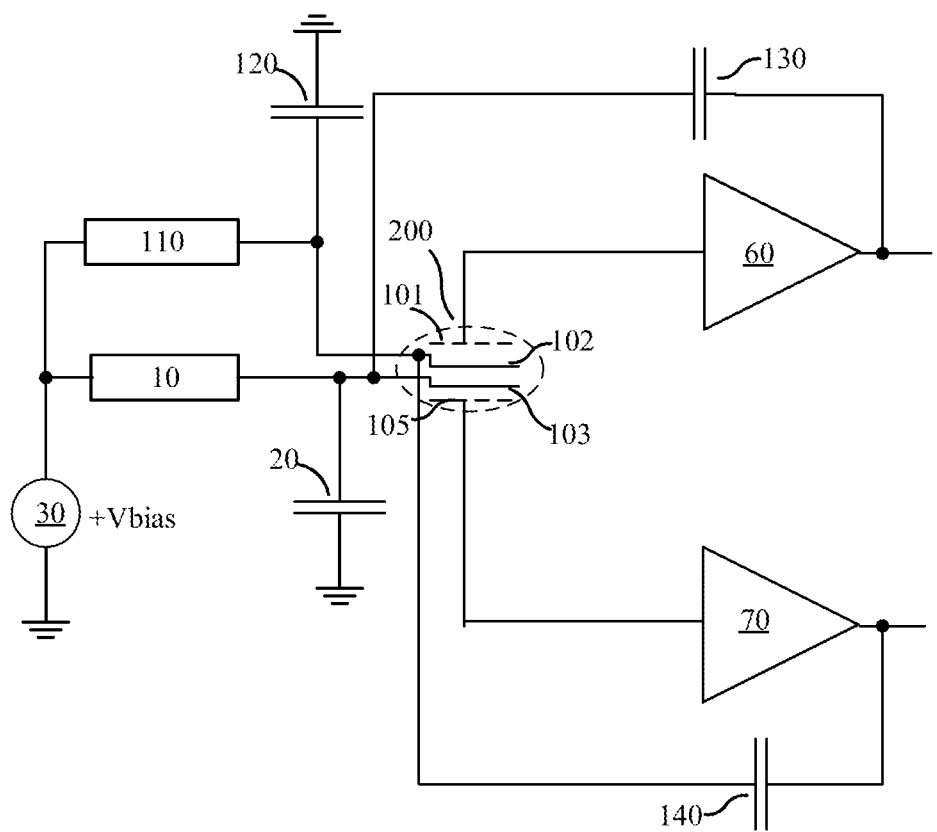
FIG. 4 illustrates a block diagram of a MEMS device with negative feed-back in accordance with an alternative embodiment of the present invention.

FIG. 4 illustrates a block diagram of a differential MEMS sensor with negative feed-back in accordance with an alternative embodiment of the present invention.

Referring to FIG. 4, in this embodiment, the output of the gain stages are coupled to the opposite moveable plate node of the MEMS device 200. Unlike, the prior embodiment in which the gain was increased with positive-feed-back, this embodiment implements an attenuation using negative feed-back. As illustrated in FIG. 4, the second capacitor 140 is coupled to the first moveable plate 102 while the first capacitor 130 is coupled to the second moveable plate 103.

In this embodiment, the gain at the first gain stage 60 (A60) is approximately (assuming that the capacitance of the capacitive filter is much greater than the variable capacitance between the plates of the MEMS device 200) given as follows: $A60=1-C130/C20$, and the gain at the second gain stage 70 (A70) is approximately given as follows: $A70=1-C140/C120$. Therefore, this embodiment results in negative gain.

In various embodiments, the structure of the MEMS device 200 is modified from a single moveable membrane to at least two moveable membranes that are electrically isolated from each other but biased independently such that the moveable membranes may be used with passive feed-back structures and the differential topology allowing gain and attenuation adjustment with capacitive feed-back.

FIGS. 5-7 illustrate an alternative implementation of the circuits described in FIGS. 2-4.

Figure 5A:
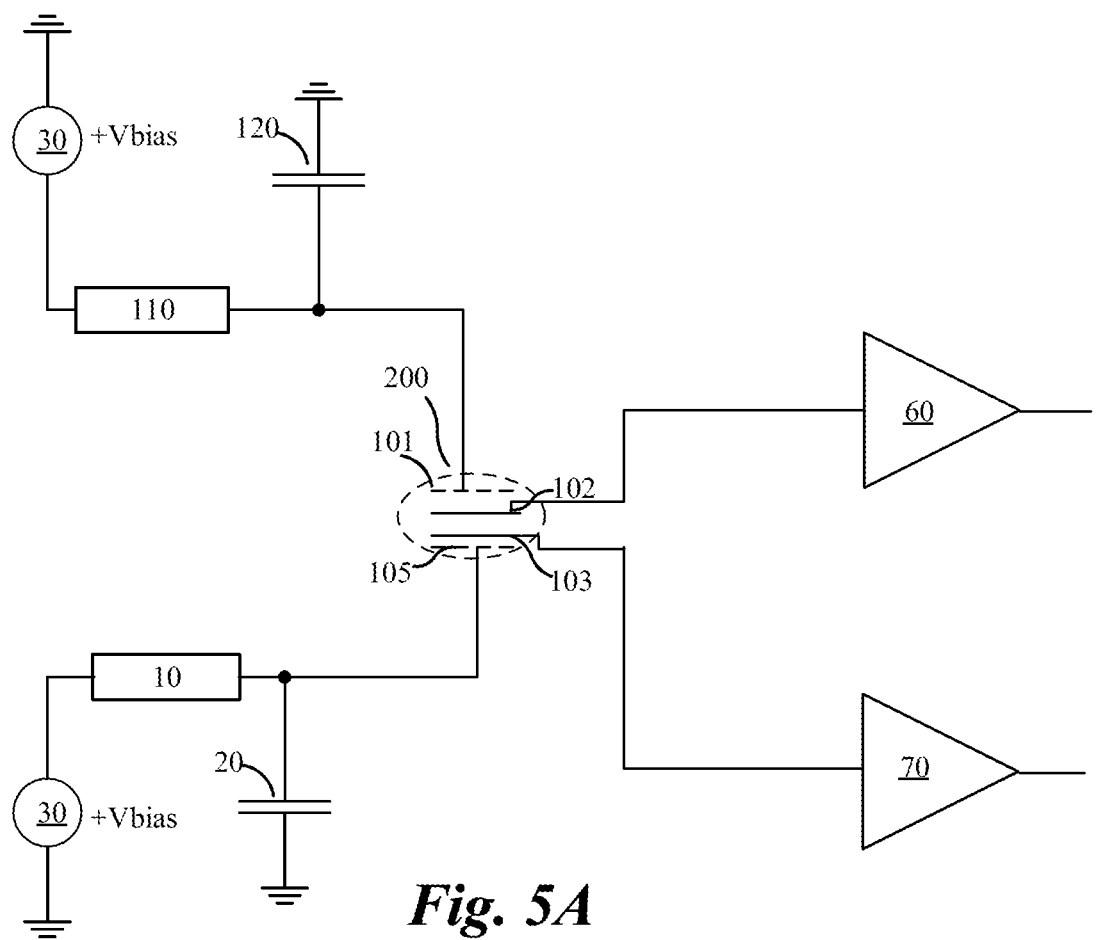
FIGS. 5A and 5B, illustrates an alternative implementation of a MEMS device in which bias is applied to the fixed plates while the moveable plates form the sense plates.

FIG. 5A illustrates an alternative implementation of a MEMS device 200 in which bias is applied to the fixed plates while the moveable plates are sensed and coupled to gain stages for further processing. In this embodiment, the voltage bias applied to the first fixed plate 101 through a first filter comprising a first resistor 100 and a first capacitive filter 120 and applied to the second fixed plate 105 through a second filter comprising a second resistor 10 and a second capacitive filter 20. As in the prior embodiment described with respect to FIG. 2, the bias signal at the node coupled to the first fixed plate 101 and the second fixed plate 105 is independently varied using the filters.

Figure 5B:
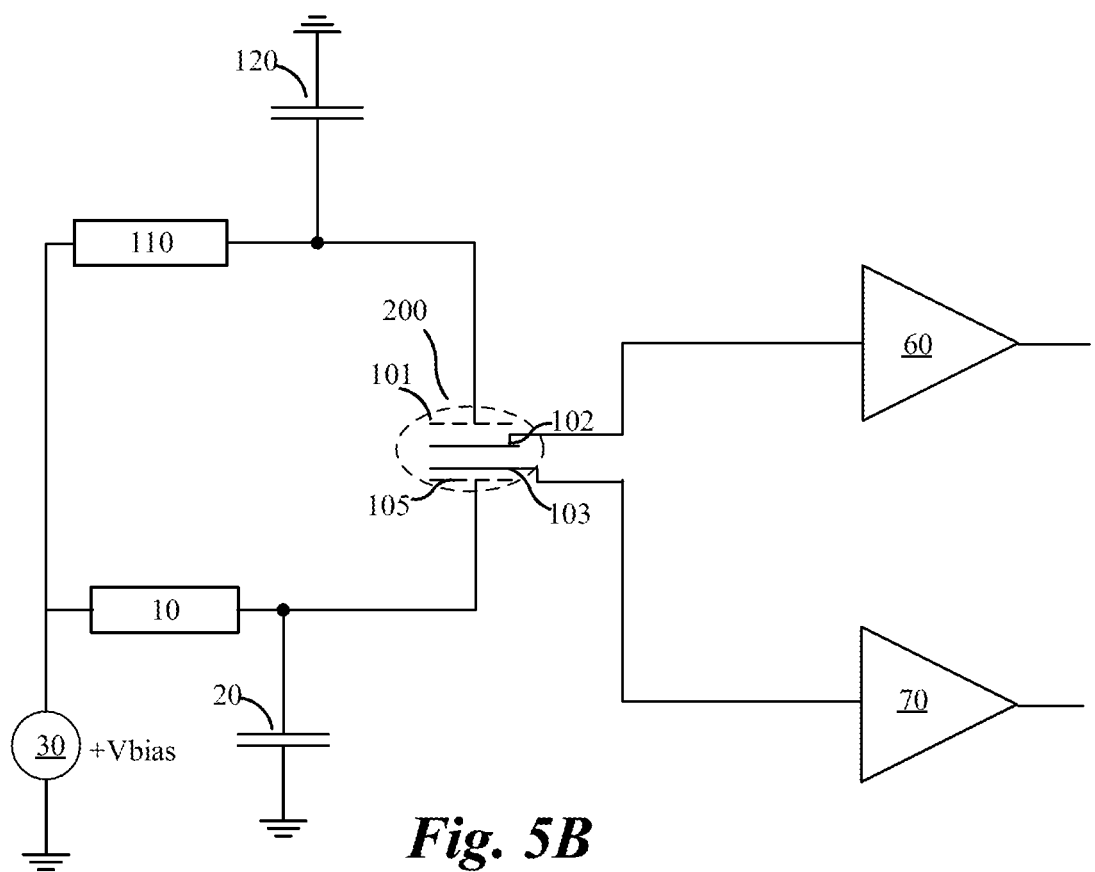

FIG. 5B illustrates an alternative embodiment using a single voltage source.

Figure 6A:
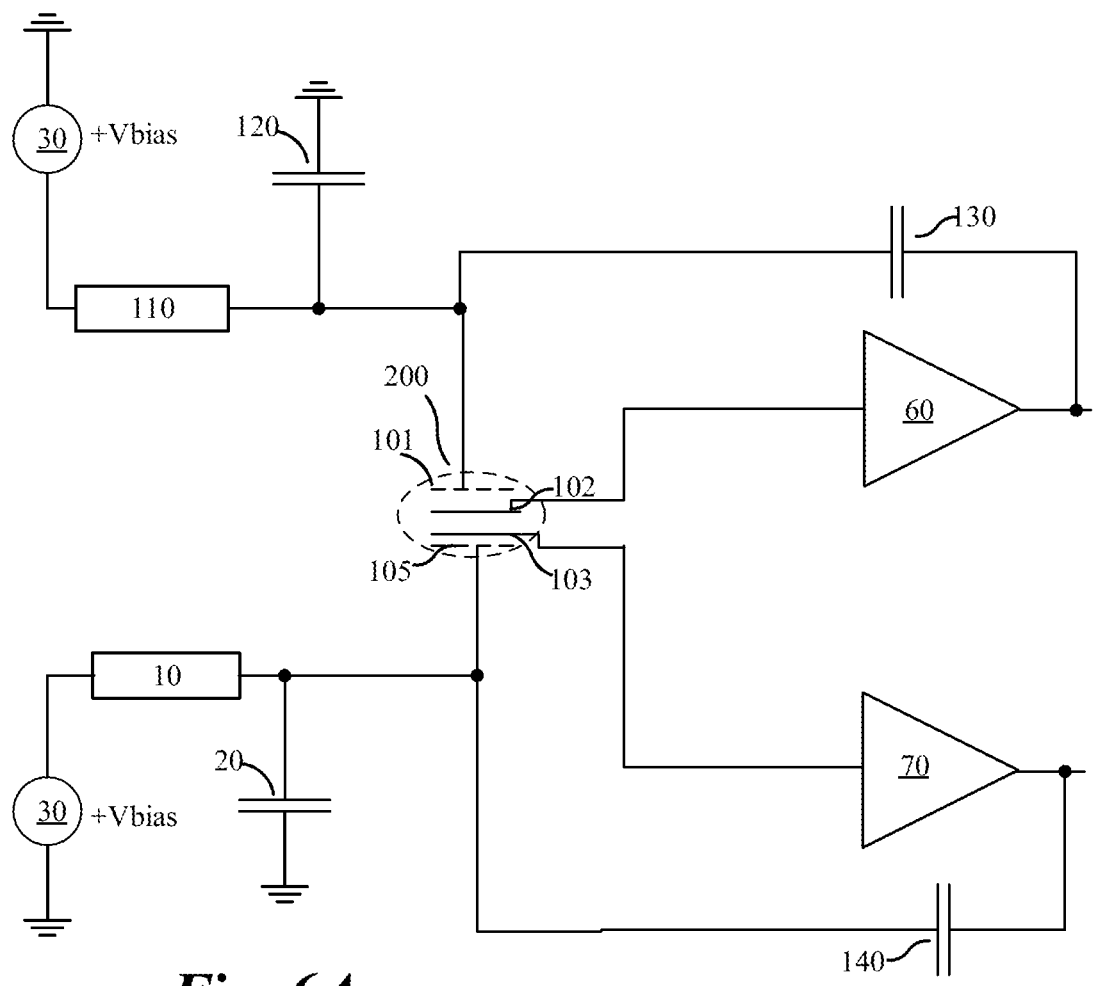
FIGS. 6A and 6B, illustrates a MEMS circuit including a capacitive positive feed-back in accordance with a further alternative embodiment of the invention.
Figure 6B:
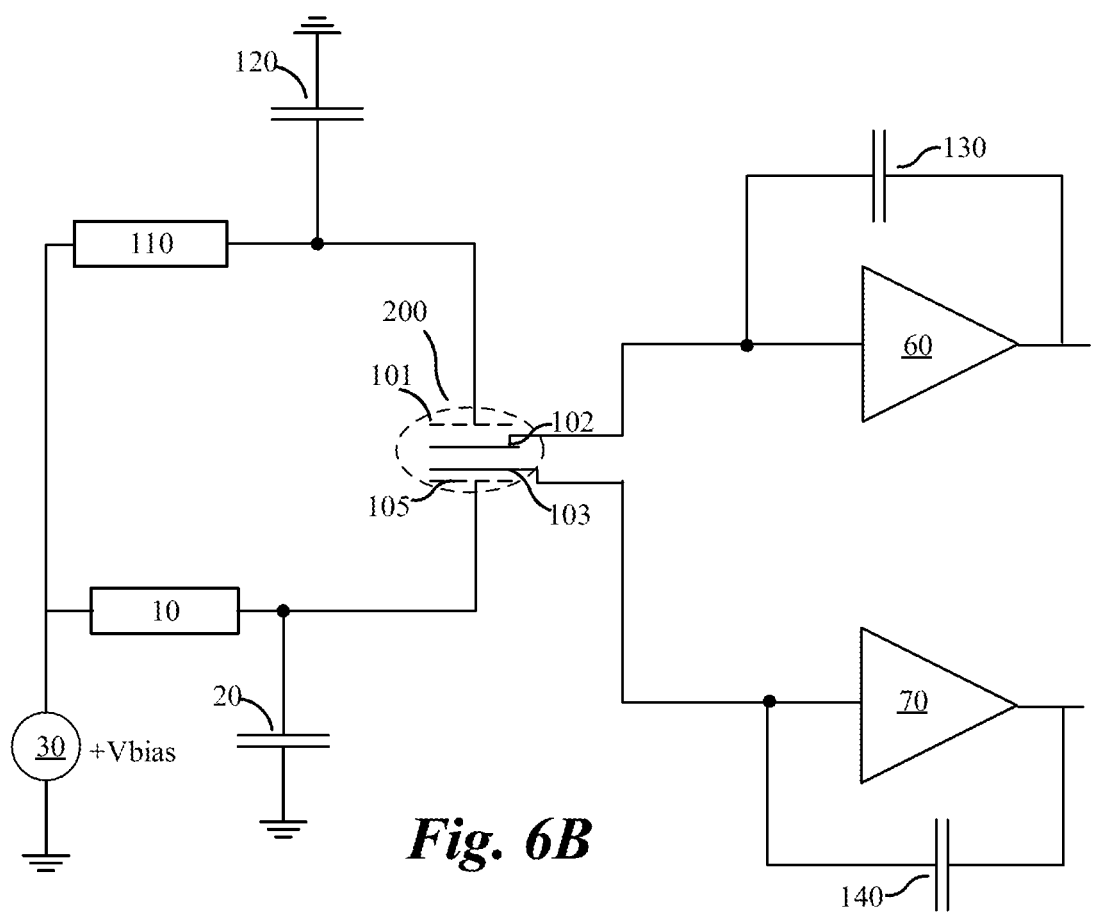

FIG. 6, which includes FIGS. 6A and 6B, illustrates a MEMS circuit including a capacitive positive feed-back in accordance with a further alternative embodiment of the invention.

As in the embodiment described using FIG. 3, referring to FIG. 6A, a first capacitor 130 and a second capacitor 140 is used to form two independent positive feed-back loops to help independently vary the bias signal at the node coupled to the first fixed plate 101 and the second fixed plate 105. This embodiment implements a positive gain at the outputs of the first and the second gain stages 60 and 70. Similarly, in FIG. 6B, the first capacitor 130 is coupled to the first moveable plate 102 while the second capacitor 140 is coupled to the second moveable plate 103 to provide positive gain.

Figure 7A:
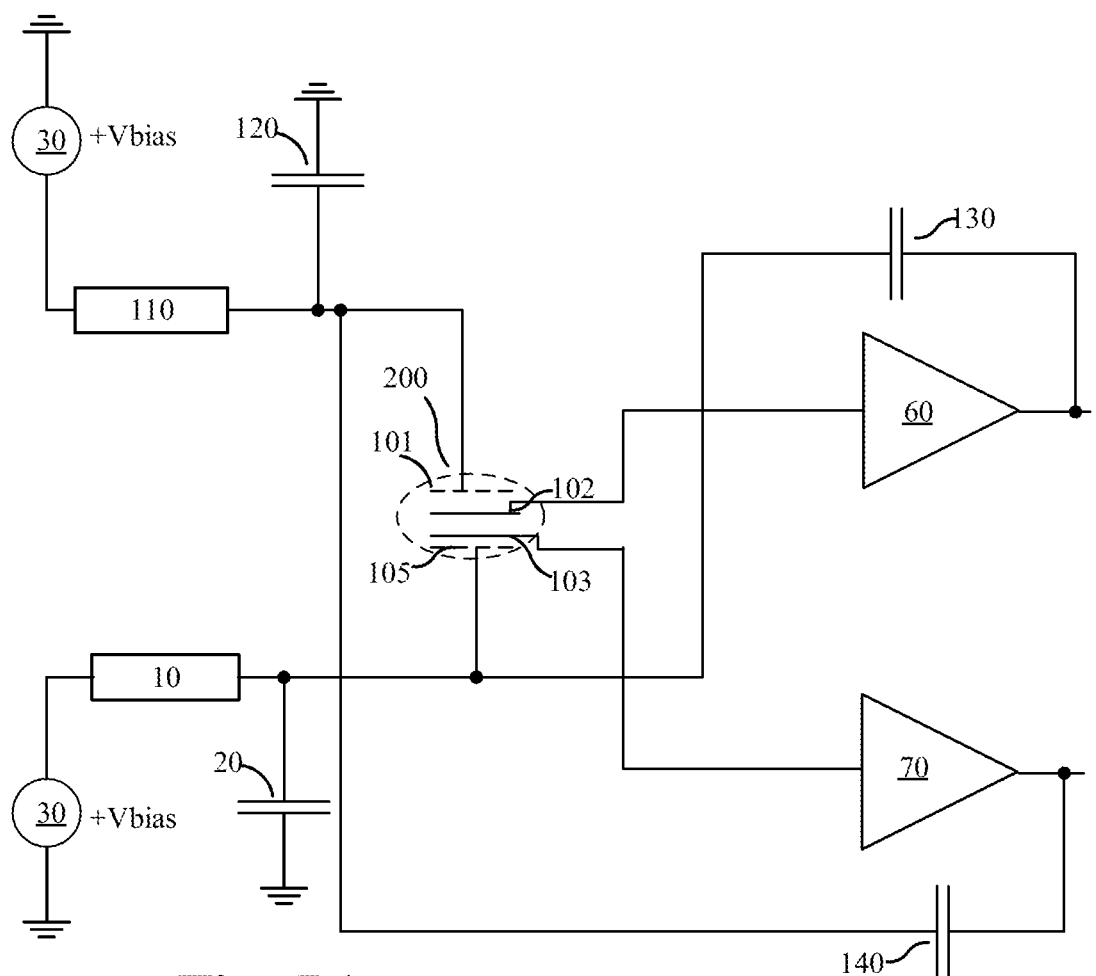
FIGS. 7A and 7B, illustrates a MEMS circuit including a capacitive negative feed-back in accordance with a further alternative embodiment of the invention.
Figure 7B:
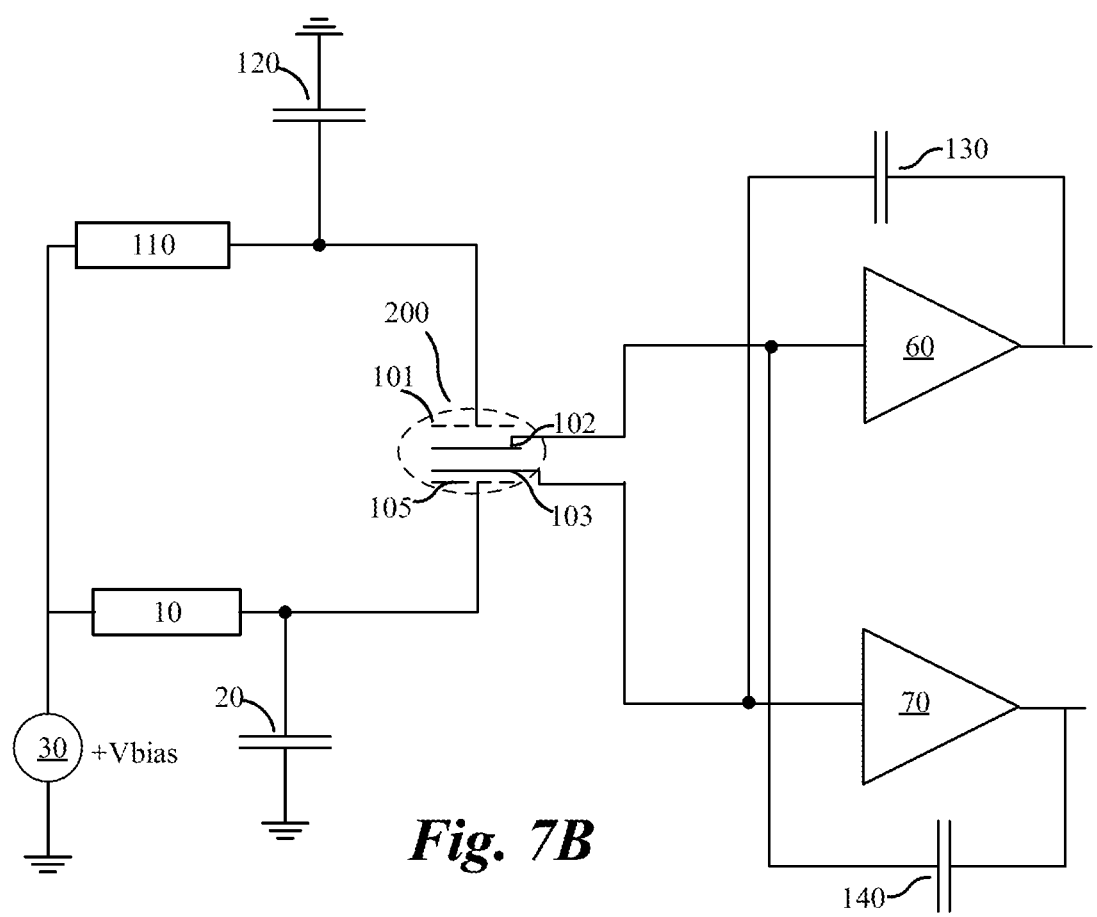

FIG. 7, which includes FIGS. 7A and 7B, illustrates a MEMS circuit including a capacitive negative feed-back in accordance with a further alternative embodiment of the invention.

As illustrated in FIG. 7A, in this embodiment implements a feed-back similar to that described in FIG. 4. The first capacitor 130 is coupled to the second fixed plate 105 and the second capacitor 140 is coupled to the first fixed plate 101 thereby creating independent negative feed-back loops. Similarly, in FIG. 7B, the first capacitor 130 is coupled to the second moveable plate 103 while the second capacitor 140 is coupled to the first moveable plate 102 to provide negative feed-back.

Figure 8A:
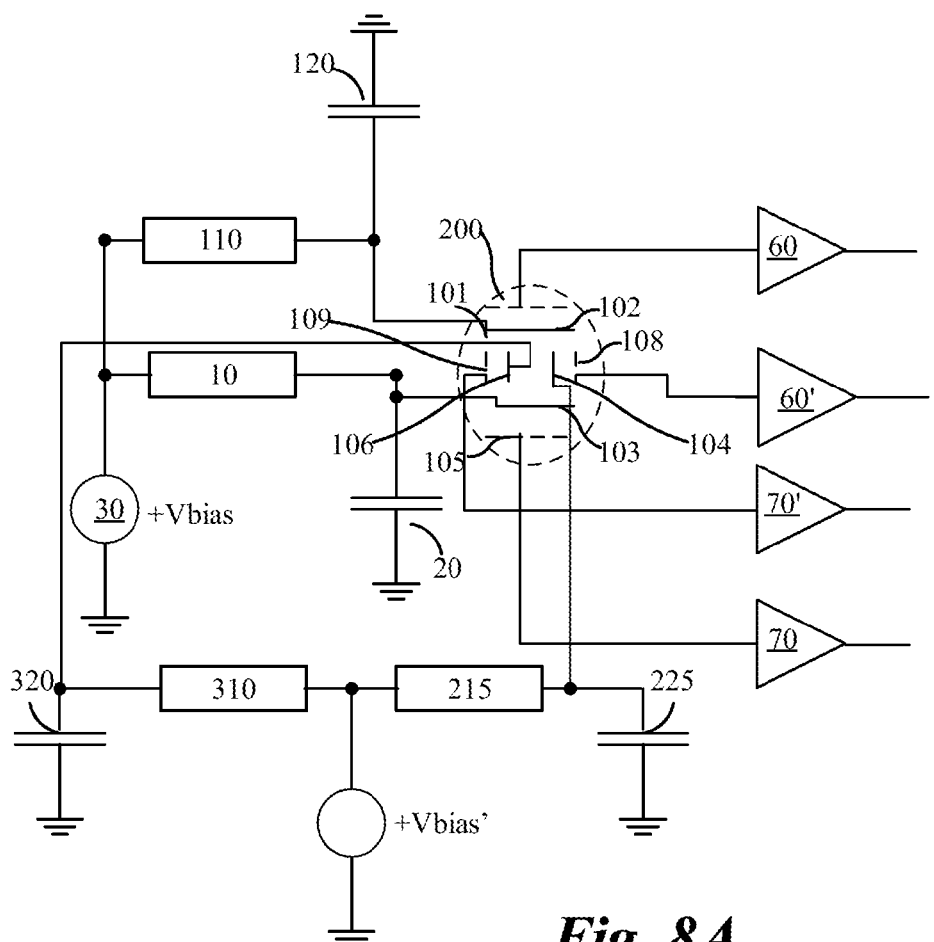
FIGS. 8A and 8B, illustrates a MEMS circuit including more than two moveable membranes independently coupled in accordance with an alternative embodiment of the present invention.
Figure 8B:
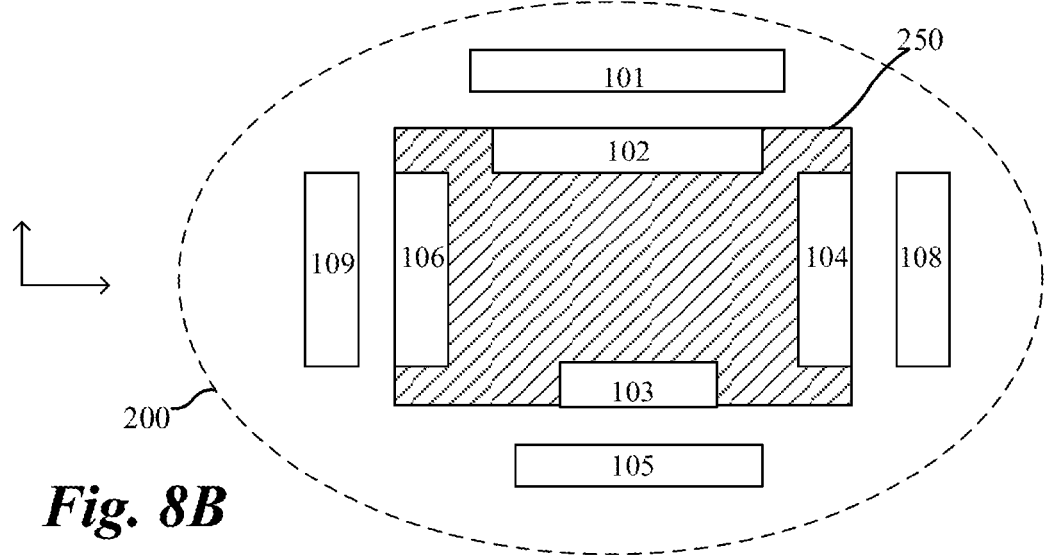

FIG. 8, which includes FIGS. 8A and 8B, illustrates a MEMS circuit including more than two moveable membranes independently coupled in accordance with an alternative embodiment of the present invention. FIG. 8B illustrates a magnified view of the MEMS device illustrated in FIG. 8A.

Referring to FIGS. 8A and 8B, the moveable mass includes a first moveable plate 102, and a second moveable plate 103 as described in prior embodiments. Further, the moveable mass includes a third moveable plate 104 and a fourth moveable plate 106 as illustrated in FIG. 8. The third moveable plate 104 is capacitively coupled to a third fixed plate 108 while the fourth moveable plate 106 is capacitively coupled to a fourth fixed plate 109. Each of the moveable plates may be coupled using separate and independent filter circuits. For example, in one case, the third moveable plate 104 may be coupled to a second voltage source through a filter comprising a third resistor 215 and a third capacitor 225 while the fourth moveable plate 106 may be coupled to the second voltage source through another filter comprising a fourth resistor 310 and a fourth capacitor 320. The output of the third fixed plate 108 and the fourth fixed plate 109 may be coupled to corresponding gain stages 60' and 70'.

Further, as an illustration, in FIG. 8B, the first and the second moveable plates 102 and 103 as well as the first and the second fixed plates 101 and 105 are shown to be of different dimensions in one embodiment.

Thus, embodiments of the present invention describe a differential capacitive microphone with improved gain using which common mode noise may be subtracted out. Such differential capacitive microphones may perform better than other microphones, e.g., with higher sensitivity due to the extra capacitor, and higher controllable bias voltage and better linearity.

In various embodiments, the MEMS circuits illustrated in FIG. 2-8 may be comprise any time of MEMS device including a microphone, oscillators, resonators, mechanical, pressure sensors, motion sensors, etc.

Figure 9:
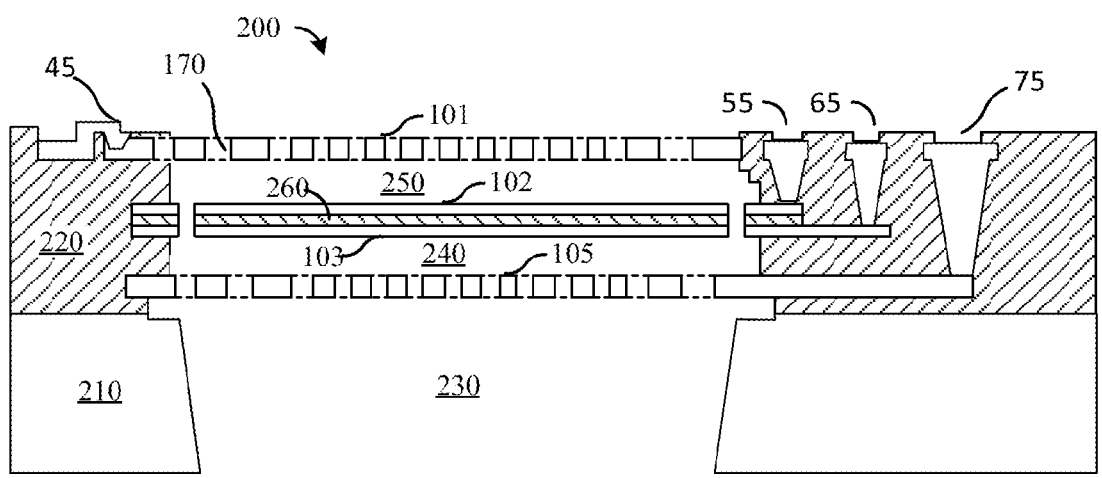
FIG. 9 illustrates a cross-sectional view of a MEMS device in accordance with an embodiment of the present invention.

FIG. 9 illustrates a cross-sectional view of a MEMS device in accordance with an embodiment of the present invention.

In various embodiments, FIG. 9 illustrates a MEMS device illustrating the embodiments of the MEMS circuit described in FIGS. 2-8. Referring to FIG. 9, the MEMS device 200 comprises a substrate 210 comprising a back side cavity 230. The back side cavity 230 extends from the back side of the substrate 210 to the front side of the substrate 210 continuously.

A first fixed plate 101 and a second fixed plate 105 are disposed above the back side cavity 230. The fixed plates may also be referred as back plates.

In one or more embodiments, the MEMS device comprises a membrane layer comprising a first moveable plate 102 and a second moveable plate 103 spaced from the first moveable plate 102, which are all disposed over the substrate 210. The membrane layer may be held over the substrate 210 by the supporting structure 220, which may also include separate support structures for each of the membrane layer and the fixed plates. In one or more embodiments, the first and the second moveable plates 102 and 103 are circular.

Additionally, a first cavity 250 is disposed between the first fixed plate 101 and the first moveable plate 102 while a second cavity 240 is disposed between the second fixed plate 105 and the second moveable plate 103. Thus, the first and the second moveable plates are anchored along the peripheral region but otherwise freely suspended. The presence of the first cavity 240 and the second cavity 250 allows the first and the second moveable plates 102 and 103 to move freely.

In various embodiments, the first moveable plate 102 is electrically isolated from the second moveable plate 103. In one or more embodiments, the first moveable plate 102 is not capacitively coupled to the second moveable plate 103, i.e., the capacitive coupling is minimized or essentially zero. Accordingly, the intermediate layer 260 may be made of an insulating material, for example, a low-k dielectric material to prevent capacitive coupling.

In various embodiments, the first moveable plate 102, the second moveable plate 103, and the intermediate layer 260 are mechanically coupled or linked as an integral unit so that they oscillate together. Therefore, when the first moveable plate 102 moves towards the first fixed plate 101, at the same time, the second moveable plate 103 moves away from the second fixed plate 105.

The first and the second fixed plates 101 and 105 may also include a plurality of bumps on the side facing the membrane layer for preventing the membrane layer from sticking onto the membrane layer. The first and the second plates 101 and 105 may also include a plurality of holes 170. The plurality of holes 170 may be used during the fabrication of the internal cavities by providing a hole for the passage of the etching liquid. Additionally, the plurality of holes 170 may provide air passage during the vibration of the membrane layer thus minimizing damping effects. For example, due to the plurality of holes 170, the first and the second fixed plates 101 and 105 are (less) insensitive to incident acoustic pressure. In contrast, the first and the second moveable plates 102 and 103 are effectively attached to the substrate 210 through springs, and therefore vibrate with the incident sound pressure. The MEMS device 200 may be enclosed in a sealed chamber.

A first contact 45 may be formed at the top surface of the supporting structure 220 for electrically coupling the first fixed plate 101. Additionally, second contacts 55, third contacts 65, and fourth contacts 75 may be used to electrically couple the first moveable plate 102, the second moveable plate 103, and the second fixed plate 105 respectively. Accordingly, the first moveable plate 102 and the second moveable plate 103 may be coupled to different potential nodes although they are moving together as one mechanical mass unit.

In various embodiments, the locations of the second contacts 55 are selected to be away from the third contacts 65 as much as possible to prevent capacitive coupling. In various embodiments, the intermediate layer 260 is configured to not affect the mechanical behavior of the membrane system, e.g., because it is designed to be a low-stress non-conductive layer. In another alternative embodiment, the intermediate layer 260 is used to improve the robustness of the membrane system compared to a single layer membrane. The two conductive layers, i.e., the first moveable plate 102 and the second moveable plate 103 may not be of the same material or dimension in various embodiments.

Figure 10A:
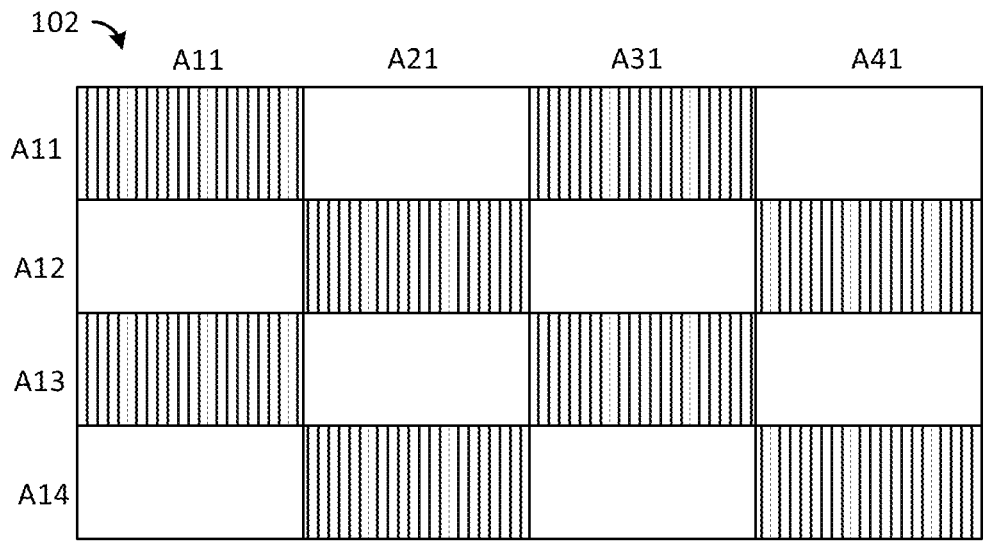
FIGS. 10A and 10B, illustrates a top view of the first moveable plate and the second moveable plate in accordance with an embodiment of the present invention.
Figure 10B:
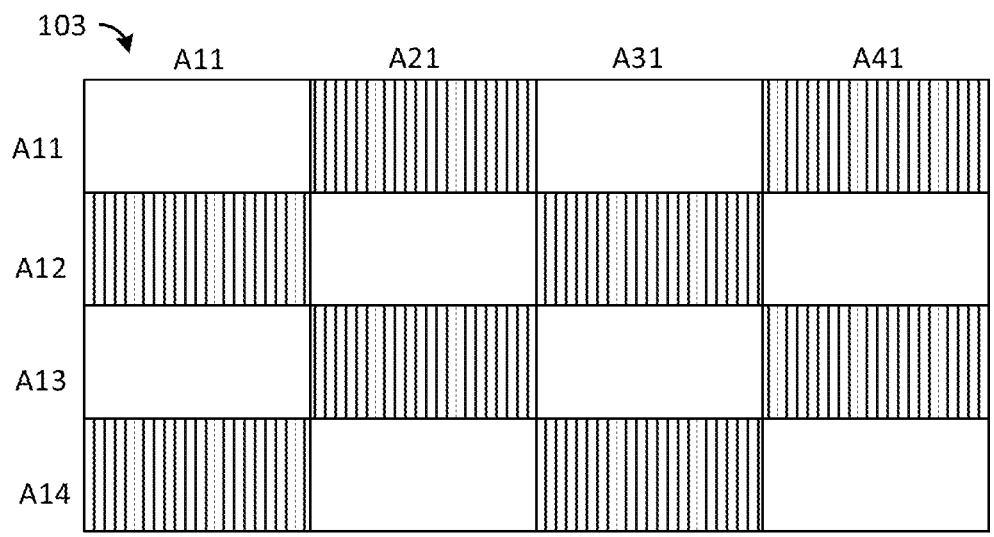

FIG. 10, which includes FIGS. 10A and 10B, illustrates a top view of the first moveable plate and the second moveable plate in accordance with an embodiment of the present invention.

In various embodiments, the first moveable plate 102 and the second moveable plate 103 may be fabricated to minimize capacitive coupling. In one embodiment, the overlap between the conductive portions of the first moveable plate 102 and the conductive portions of the first moveable plate 102 of the second moveable plate 103 is minimized.

For example, FIG. 10A illustrates a first moveable plate 102 having conductive regions and insulating regions alternatively. For example, the shaded box A11 includes a conductive region while the non-shaded box A21 includes an insulating region.

In contrast, in FIG. 10B shows the corresponding region of the second moveable plate 103 that is directly below the first moveable plate 102. Like FIG. 10A, in FIG. 10B, the non-shaded box A11 includes an insulating region while the shaded box A21 includes a conductive region. Thus, the pattern in the second moveable plate 103 is the inverse of the pattern in the first moveable plate 102.

Figure 11:
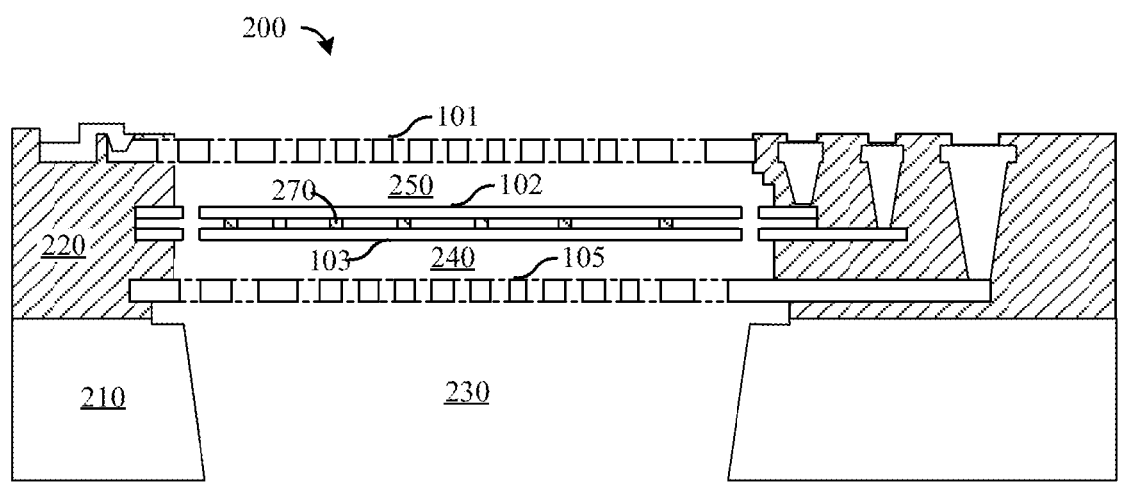
FIG. 11 illustrates a cross-sectional view of an alternative MEMS device in accordance with an embodiment of the present invention.

FIG. 11 illustrates an alternative MEMS device in accordance with an embodiment of the present invention.

In this embodiment, the capacitive coupling between the first moveable plate 102 and the second moveable plate 103 is minimized by introducing an air gap or a plurality of small cavities. The first moveable plate 102 is still rigidly coupled mechanically with the second moveable plate 103 using linkages 270, which are supporting pillars.

FIG. 12, which includes FIGS. 12A-12E, illustrates a MEMS device during various stages of fabrication in accordance with an embodiment of the present invention.

Figure 12A:
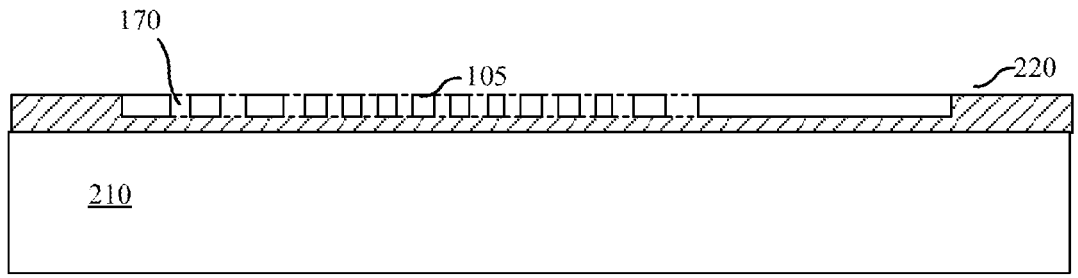
FIGS. 12A-12E, illustrates a MEMS device during various stages of fabrication in accordance with an embodiment of the present invention.

FIG. 12A illustrates a semiconductor substrate after forming the first fixed plate of the MEMS structure in accordance with an embodiment of the present invention.

FIG. 12A illustrates a supporting structure 220 formed over a substrate 210. The substrate 210 may be a semiconductor substrate in various embodiments. The substrate 210 may be a semiconductor bulk substrate or a semiconductor on insulator substrate in some embodiments. Some examples of the substrate 210 include a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In various embodiments, the substrate 210 may include blanket epitaxial layers. In various embodiments, the substrate 210 may be a silicon wafer, a germanium wafer, or may be a compound semiconductor substrate including indium antimonide, indium arsenide, indium phosphide, gallium nitride, gallium arsenide, gallium antimonide or combinations thereof. In one embodiment, the substrate 210 may comprise a heteroepitaxial layer such as a gallium nitride grown on a silicon wafer.

The supporting structure 220 comprises an insulating layer in various embodiments. The supporting structure 220 may comprise a nitride layer in one embodiment. In another embodiment, the supporting structure 220 may include an oxide layer. In various embodiments, the supporting structure 220 may be formed by thermal oxidation, nitridation, using vapor deposition processes such as chemical vapor deposition, plasma vapor deposition, and/or spin-on processes. In various embodiments, the supporting structure 220 may include multiple layers deposited at different stages of processing.

In one or more embodiment, the second fixed plate 105 is fabricated over the substrate 210. The second fixed plate 105 may comprise a polysilicon layer in one embodiment. For example, one or more layers of polysilicon may be deposited and patterned to form the second fixed plate 105.

Figure 12B:
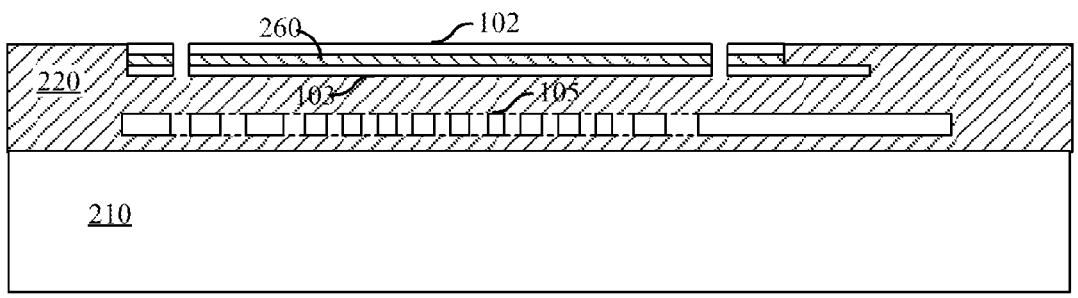

FIG. 12B illustrates a semiconductor substrate after forming the moveable membrane layers of the MEMS structure in accordance with an embodiment of the present invention.

The first and the second moveable plates 102 and 103 may be fabricated next. In one embodiment, the first and the second moveable plates 102 and 103 are patterned sequentially, for example, the second moveable plate 103 may be deposited and patterned, which is followed by the deposition and patterning of the first moveable plate 102. Alternatively, the first and the second moveable plates 102 and 103 may be deposited sequentially and patterned one after the other after depositing both the layers.

The first and the second moveable plates 102 and 103 may comprise poly silicon. In an alternative embodiment, the first and the second moveable plates 102 and 103 comprises an amorphous silicon layer. In alternative embodiments, the first and the second moveable plates 102 and 103 comprises a conductive layer. The first and the second moveable plates 102 and 103 along with the intermediate layer together may have a thickness of about 100 nm to about 2000 nm in various embodiments. In one or more embodiments, the total thickness of the moveable portion of the MEMS device has a thickness of about 200 nm to about 1000 nm.

A layer of the intermediate layer 260 may be deposited and patterned optionally after depositing the second moveable plate 103 before depositing the first moveable plate 102. Another layer of the supporting structure 220 may also be deposited and planarized.

Figure 12C:
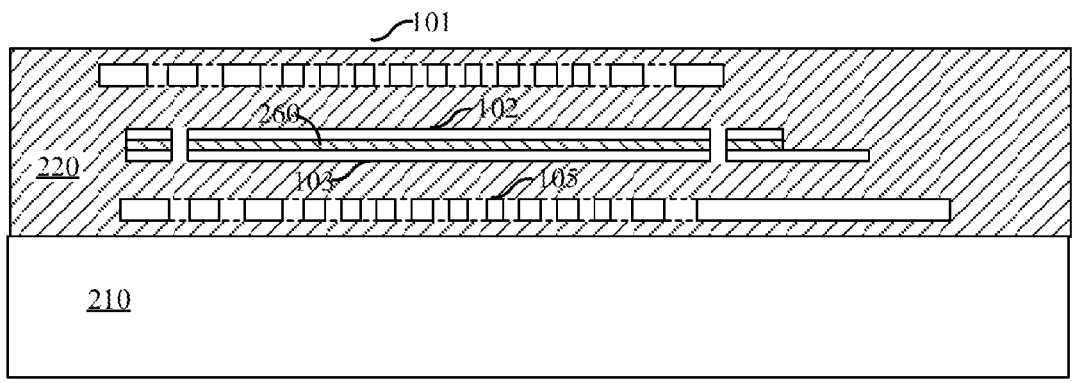

FIG. 12C illustrates a semiconductor substrate after forming the top fixed plate of the MEMS structure in accordance with an embodiment of the present invention.

As illustrated in FIG. 12C, the first fixed plate 101 is formed over the moveable membrane layers. The first fixed plate 101 may be deposited and patterned. In one embodiment, one or more layers of poly silicon may be deposited and patterned. Another layer of the supporting structure 220 may be deposited and planarized after forming the first fixed plate 101 in one embodiment.

Figure 12D:
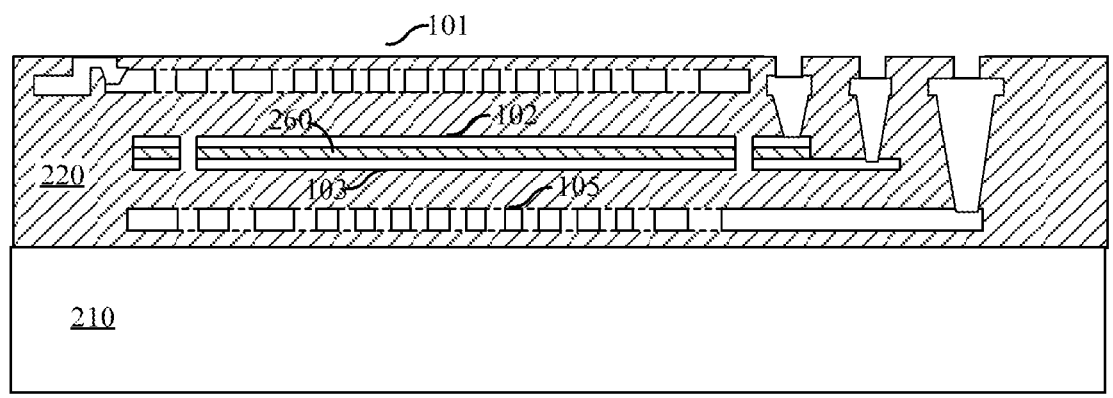

FIG. 12D illustrates a semiconductor substrate after front side processing of the MEMS structure in accordance with an embodiment of the present invention.

Contacts may be formed for contacting the substrate 210, the first fixed plate 101, the second fixed plate 105, the first moveable plate 102, and the second moveable plate 103. The contacts may be formed after masking and patterning the supporting structure 220.

The front side may be protected during subsequent back side processing by forming a protective layer 280. In various embodiments, the protective layer 280 may comprise silicon nitride or silicon oxide.

Figure 12E:
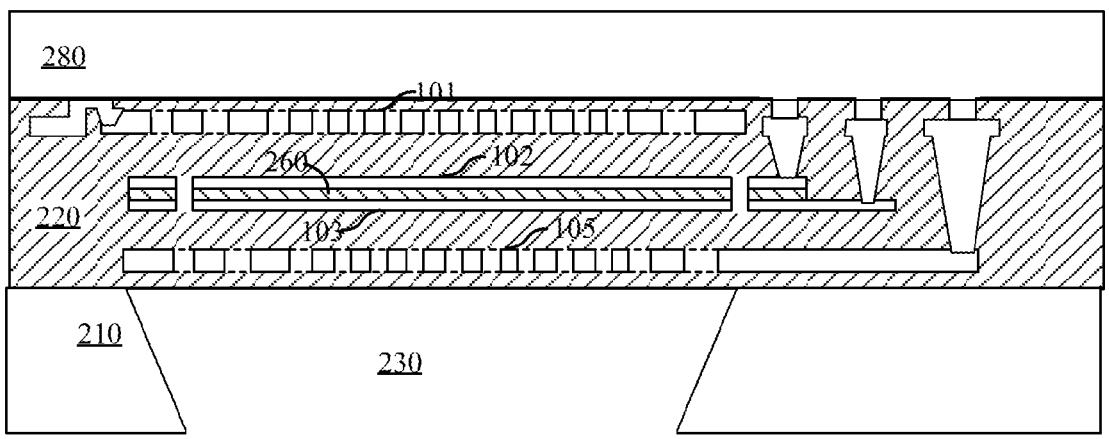

FIG. 12E illustrates the MEMS device after forming a cavity in accordance with an embodiment of the present invention.

Back side processing continues from FIG. 12E to form a back side cavity 230. The substrate 210 is reversed or flipped upside down to expose the back side. Next, a resist is deposited on the exposed back side and patterned (not shown) and a portion of the substrate 210 in the MEMS device region is exposed. The exposed substrate 210 is etched until the regions of the supporting structure 220 are exposed.

In various embodiments, the substrate 210 may be etched using a Bosch Process, or by depositing a hard mask layer and etching the substrate 210 using a vertical reactive ion etch process. In one embodiment, only a resist mask is used. If the resist budget is not sufficient, the hard mask and vertical reactive ion etch may be used to achieve a smooth sidewall. However, this integration scheme requires the removal of remaining hard mask residues. Hence, in some embodiments, a Bosch process may be used without additional hard mask.

In the Bosch process, an isotropic plasma etch step and passivation layer deposition step are alternated. The etching/deposition steps are repeated many times during the Bosch process. The plasma etch is configured to etch vertically, e.g., using Sulfur hexafluoride [$SF_6$] in the plasma. The passivation layer is deposited, for example, using octa-fluoro-cyclobutane as a source gas. Each individual step may be turned on for a few seconds or less. The passivation layer protects the substrate 210 and prevents further etching. However, during the plasma etching phase, the directional ions that bombard the substrate remove the passivation layer at the bottom of the trench (but not along the sides) and etching continues. The Bosch process is stopped when the supporting structure 220 are exposed. The Bosch process produces sidewalls that are scalloped.

Referring next, for example, to FIG. 8, regions of the exposed supporting structure 220 are removed to form a first cavity 240 and a second cavity 250, for example, using a wet etch chemistry. The wet etch may be selective in one or more embodiments. The release etch may be performed from the front side and/or the back side of the substrate 210 in various embodiments. Subsequent processing may continue as used during conventional MEMS processing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-12 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A micro-electro-mechanical system (MEMS) device comprising:
    a first plate;
    a second plate disposed over the first plate;
    a first moveable plate disposed between the first plate and the second plate; and
    a second moveable plate disposed between the first moveable plate and the second plate, wherein the MEMS device comprises a first input/output node coupled to the first plate, a second input/output node coupled to the second plate, a third input/output node coupled to the first moveable plate, and a fourth input/output node coupled to the second moveable plate, wherein the first input/output node is a different input/output node from the second input/output node, and wherein the third input/output node is a different input/output node from the fourth input/output node, wherein the first moveable plate is rigidly coupled to the second moveable plate, and wherein the first moveable plate is configured to be shielded from capacitive coupling with the second moveable plate.

2. The device of claim 1, further comprising:
    a bottom cavity disposed under the first plate;
    a first cavity disposed between the first plate and the first moveable plate; and
    a second cavity disposed between the second plate and the second moveable plate.

3. The device of claim 1, wherein the first moveable plate is configured to be coupled to a different potential node than the second moveable plate.

4. The device of claim 1, wherein the first moveable plate is configured to be coupled to a voltage source through a first filter, and wherein the second moveable plate is configured to be coupled to the voltage source through a second filter.

5. The device of claim 4, wherein the first filter and the second filter comprise different RC filters.

6. The device of claim 1, wherein the first plate is a first fixed plate and wherein the second plate is a second fixed plate.

7. The device of claim 6, wherein the first fixed plate is configured to be coupled to a voltage source through a first filter, and wherein the second fixed plate is configured to be coupled to the voltage source through a second filter.

8. The device of claim 6, further comprising:
    a third moveable plate and a fourth moveable plate; and
    a third fixed plate and a fourth fixed plate, wherein the third moveable plate is capacitively coupled to the third fixed plate, wherein the fourth moveable plate is capacitively coupled to the fourth fixed plate.

9. The device of claim 8, the first moveable plate is configured to be coupled to a first voltage source through a first filter, wherein the second moveable plate is configured to be coupled to the first voltage source through a second filter, wherein the third moveable plate is configured to be coupled to a second voltage source through a third filter, and wherein the fourth moveable plate is configured to be coupled to the second voltage source through a fourth filter.

10. The device of claim 9, wherein the first filter and the second filter comprise different RC filters, and wherein the third filter and the fourth filter comprise different RC filters.

11. A sensor circuit comprising:
    a micro-electro-mechanical system (MEMS) structure forming a four terminal capacitive sensor, the MEMS structure comprising a first plate of a first type, a second plate of the first type, a first plate of a second type, and a second plate of the second type;
    a first filter circuit coupled between a voltage source and a first input bias node configured to be coupled to the first plate of a first type of the four terminal capacitive sensor; and
    a second filter circuit coupled between the voltage source and a second input bias node configured to be coupled to the second plate of the first type of the capacitive sensor, wherein the second filter circuit is a different circuit from the first filter circuit, wherein the capacitive sensor comprises the first plate of the first type capacitively coupled to the first plate of the second type and the second plate of the first type capacitively coupled to the second plate of the second type, wherein the first plate of the first type is rigidly coupled to the second plate of the first type, and wherein the first plate of the first type is configured to be shielded from capacitive coupling with the second plate of the first type.

12. The circuit of claim 11, wherein the first filter circuit comprises a first resistor coupled between the voltage source and the first input bias node and a first capacitor coupled between a fixed potential and the first input bias node, and wherein the second filter circuit comprises a second resistor coupled between the voltage source and the second input bias node and a second capacitor coupled between the fixed potential and the second input bias node.

13. The circuit of claim 12, wherein the first resistor comprises a diode or a metal insulator semiconductor transistor, wherein the first capacitor comprises a metal insulator semiconductor capacitor.

14. The circuit of claim 11, wherein the capacitive sensor comprises a MEMS microphone.

15. The circuit of claim 11, wherein the first plate of the first type is a first moveable plate, wherein the second plate of the first type is a second moveable plate, wherein the first plate of the second type is a first fixed plate, and wherein the second plate of the second type is a second fixed plate.

16. The circuit of claim 15, further comprising:
    a first amplifier comprising an input node coupled to a first output bias node configured to be coupled to the first fixed plate of the capacitive sensor; and
    a second amplifier comprising an input node coupled to a second output bias node configured to be coupled to the second fixed plate of the capacitive sensor.

17. The circuit of claim 16, further comprising:
    a first feed-back capacitor coupled between the first input bias node and an output node of the first amplifier; and a second feed-back capacitor coupled between the second input bias node and an output node of the second amplifier.

18. The circuit of claim 16, further comprising:
a first feed-back capacitor coupled between the second input bias node and an output node of the first amplifier; and
a second feed-back capacitor coupled between the first input bias node and an output node of the second amplifier.

19. The circuit of claim 11, wherein the first plate of the first type is a first fixed plate, wherein the second plate of the first type is a second fixed plate, wherein the first plate of the second type is a first moveable plate, wherein the second plate of the second type is a second moveable plate.

20. The circuit of claim 19, further comprising:
a first amplifier comprising an input node coupled to a first output bias node configured to be coupled to the first moveable plate of the capacitive sensor; and
a second amplifier comprising an input node coupled to a second output bias node configured to be coupled to the second moveable plate of the capacitive sensor.

21. The circuit of claim 20, further comprising:
a first feed-back capacitor coupled between the input node of the first amplifier and an output node of the first amplifier; and
a second feed-back capacitor coupled between the input node of the second amplifier and an output node of the second amplifier.

22. The circuit of claim 20, further comprising:
a first feed-back capacitor coupled between the input node of the second amplifier and an output node of the first amplifier; and
a second feed-back capacitor coupled between the input node of the first amplifier and an output node of the second amplifier.

23. A method of forming a micro-electro-mechanical system (MEMS) device, the method comprising:
forming a first plate in or over a substrate;
forming a second plate over the first plate;
forming a first moveable plate between the first plate and the second plate; and
forming a second moveable plate between the first moveable plate and the second plate, wherein the MEMS device comprises a first input/output node coupled to the first plate, a second input/output node coupled to the second plate, a third input/output node coupled to the first moveable plate, and a fourth input/output node coupled to the second moveable plate, wherein the first input/output node is a different input/output node from the second input/output node, and wherein the third input/output node is a different input/output node from the fourth input/output node, wherein the first moveable plate is rigidly coupled to the second moveable plate, and wherein the first moveable plate is configured to be shielded from capacitive coupling with the second moveable plate.

24. The method of claim 23, wherein the first moveable plate and the second moveable plate are formed as part of a same moveable mass, and wherein the first moveable plate is configured to be shielded from capacitive coupling with the second moveable plate.

25. The method of claim 23, further comprising:
forming a bottom cavity in the substrate under the first plate;
forming a first cavity between the first plate and the first moveable plate; and
forming a second cavity between the second plate and the second moveable plate.

* * * * *